United States Patent
Malik et al.

(10) Patent No.: US 6,192,508 B1
(45) Date of Patent: Feb. 20, 2001

(54) METHOD FOR LOGIC OPTIMIZATION FOR IMPROVING TIMING AND CONGESTION DURING PLACEMENT IN INTEGRATED CIRCUIT DESIGN

(75) Inventors: Sharad Malik, Princeton, NJ (US); Lawrence Pileggi, Pittsburgh, PA (US); Abhijeet Chakraborty, Sunnyvale, CA (US); Gary K. Yeap, San Jose, CA (US); Douglas B. Boyle, Palo Alto, CA (US)

(73) Assignee: Monterey Design Systems, Sunneyvale, CA (US)

( * ) Notice: Under 35 U.S.C. 154(b), the term of this patent shall be extended for 0 days.

(21) Appl. No.: 09/097,076

(22) Filed: Jun. 12, 1998

(51) Int. Cl.[7] .................................................. G06F 17/50
(52) U.S. Cl. .................................... 716/9; 716/10; 716/13
(58) Field of Search ............................ 395/500.1; 716/9, 716/10, 13

(56) References Cited

U.S. PATENT DOCUMENTS

| | | | |
|---|---|---|---|
| 4,484,292 | * 11/1984 | Hong et al. | 716/13 |
| 5,557,533 | * 9/1996 | Koford et al. | 706/13 |
| 5,561,772 | * 10/1996 | Dorner et al. | 710/101 |
| 5,572,482 | * 11/1996 | Hoshizaki et al. | 365/233 |
| 5,847,965 | * 12/1998 | Cheng | 395/500.09 |

\* cited by examiner

Primary Examiner—Kevin J. Teska
Assistant Examiner—Hugh Jones
(74) Attorney, Agent, or Firm—Burns Doane Swecker & Mathis L.L.P

(57) ABSTRACT

This invention recognizes the ability of logic optimization to help placement relieve congestion. Different types of logic optimizations are used to help placement relieve congestion. In one type of optimization, the speed of parts of the circuit is improved by selecting faster cells. In another type of optimization, the topology of the circuit is changed such that placement can now move cells, which could not have been moved before, to reduce congestion and thus enable routing. A distinguishing feature of this methodology is that it not only uses the placement information for interconnection delay/area estimates during logic optimization, but also uses logic optimization to aid the physical placement steps by providing support to placement so that the congestion of the circuit is improved. The aim is to avoid getting into a situation where the placed circuit cannot be routed.

18 Claims, 4 Drawing Sheets

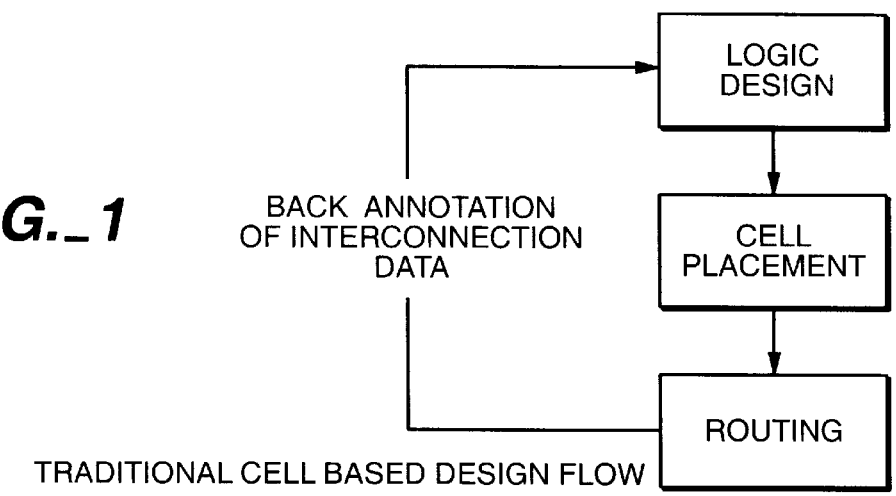
FIG._1 TRADITIONAL CELL BASED DESIGN FLOW
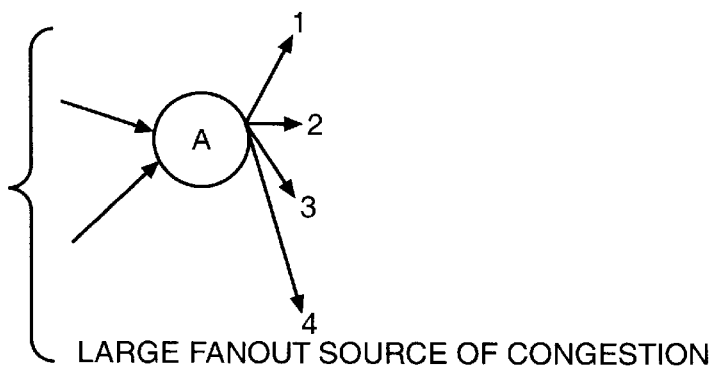
FIG._3A LARGE FANOUT SOURCE OF CONGESTION
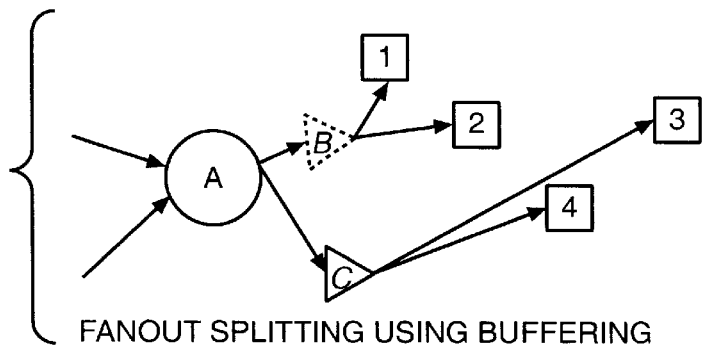
FIG._3B FANOUT SPLITTING USING BUFFERING
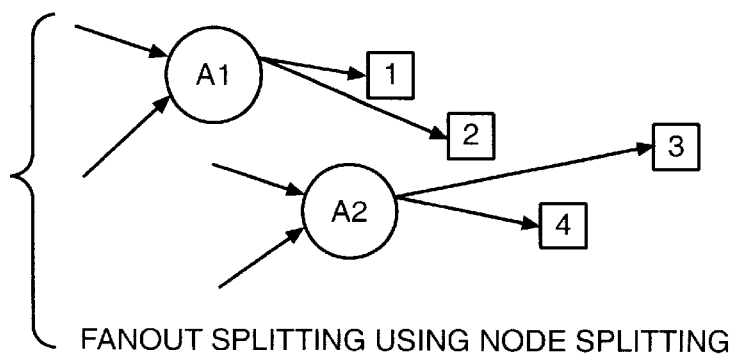
FIG._3C FANOUT SPLITTING USING NODE SPLITTING

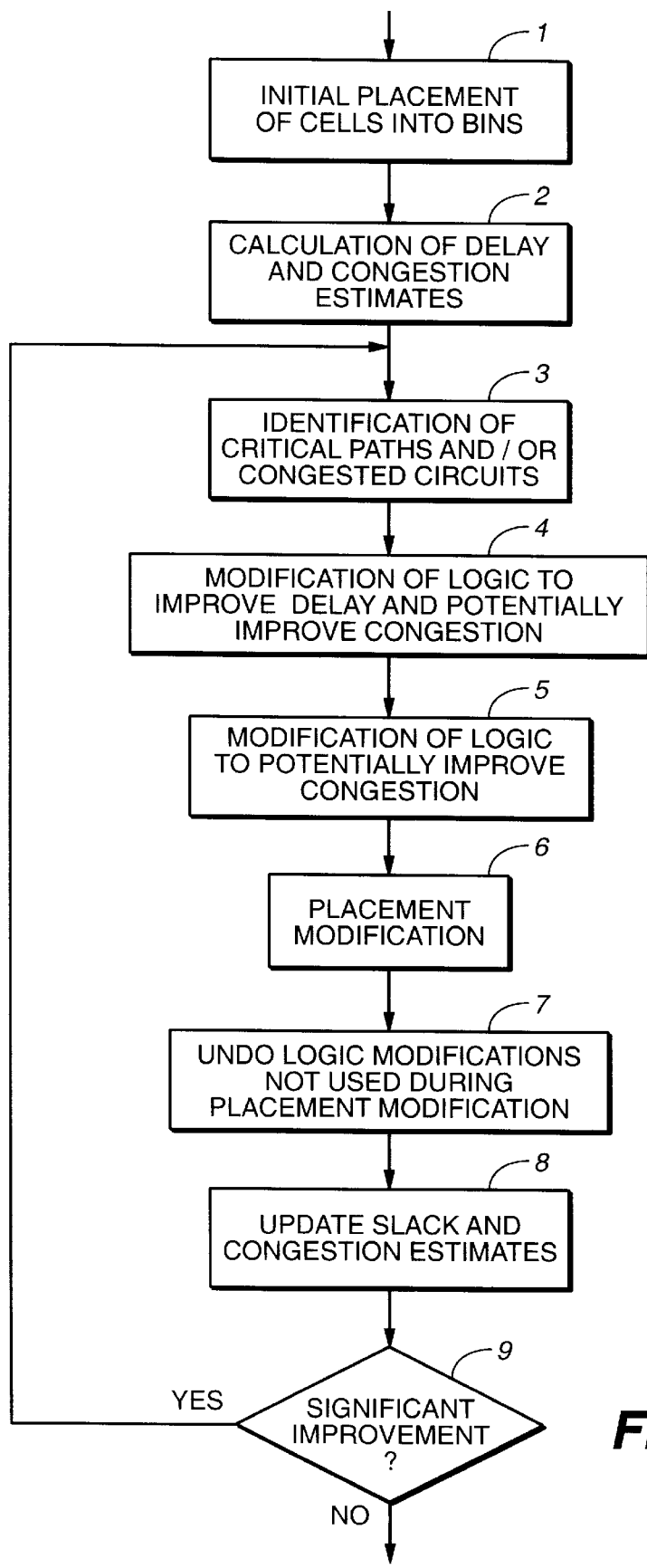
FIG._2

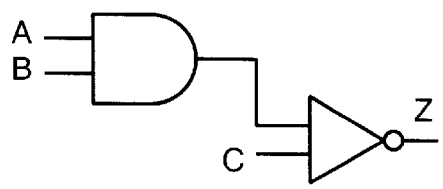
BOTH GATES ARE
IN THE SAME BIN
FIG._4A
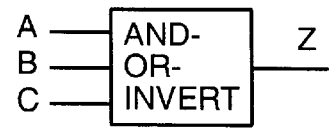
FIG._4B
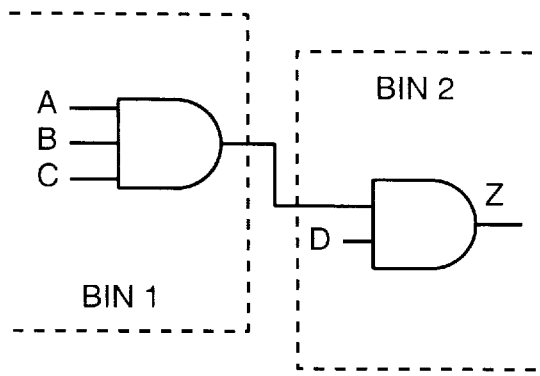
FIG._5A
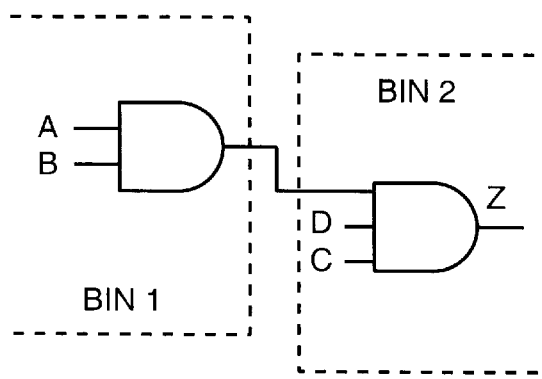
FIG._5B
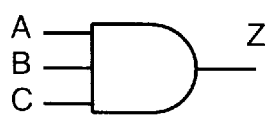
FIG._6A
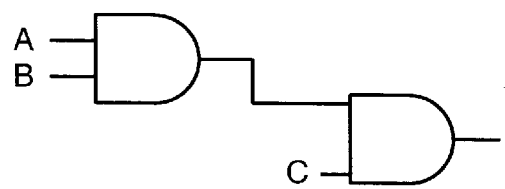
FIG._6B

METHOD FOR LOGIC OPTIMIZATION FOR IMPROVING TIMING AND CONGESTION DURING PLACEMENT IN INTEGRATED CIRCUIT DESIGN

This application is related by subject matter to U.S. Application Ser. No. 09/097,299 entitled METHOD FOR DESIGN OPTIMIZATION USING LOGICAL AND PHYSICAL INFORMATION, filed on even date herewith and incorporated herein by reference.

BACKGROUND OF THE INVENTION

1. Field of the Invention

The present invention relates to integrated circuit design and layout.

2. State of the Art

Traditional cell-based integrated circuit design follows several steps. The first step is designing the logical gate-level circuit that implements the function to be realized by the circuit (referred to as logic design or logic synthesis, of which logic optimizations are a key part). The next step is placing the gates (or cells) in a physical layout, and the final step is routing the interconnection between the cells. With increasing dominance of interconnection delays and area in circuits implemented in deep submicron technologies, this approach is proving to be no longer viable. The problem is that, during the logic optimization stage, the interconnection is not known yet, and thus the dominant part of the area and the delay cannot be considered.

Attempts to overcome this problem have considered alternating logic synthesis and placement and routing, with "back annotation" of the interconnect information to the subsequent logic synthesis steps. Referring to FIG. 1, showing traditional cell-based design flow, a logic design phase is followed by a cell placement phase and then a routing phase. Following the routing phase, interconnection data is back annotated. The logic design, cell placement and routing phases are then repeated. This cycle is continued until, during the routing phase, the design is successfully routed. The problem with this method is that the logic synthesis steps that consider the back annotation information cannot guarantee to fix problems that prevent routing without introducing additional problems due to the modifications made to the circuit gates and topology. There results a large number of iterations between logic synthesis and subsequent place and route, with the possibility of the process never converging.

An alternative approach is to consider placement information during logic optimization. In this methodology, sometimes termed "placement aware synthesis," placement information is made available in varying degrees during logic optimization, i.e. some placement is done as part of logic synthesis (sometimes referred to in the industry as just synthesis). Logic optimization uses this placement information to estimate the effect of the interconnects on the delay and the area of the circuit. Thus logic optimization attempts to accurately model the interconnect delay and area that might result during a placement step. However, it may result in a placed circuit that cannot be routed using the area resources provided by the placement step. The inability to route the resulting placed circuit results in modifications to the placement, consequently nullifying the interconnection information used during logic optimization.

A circuit that has been placed but cannot be routed subject to the available area constraints is not realizable. Additional routing resources must be created to enable the routing. There results an increase in circuit area and possibly delay, since the wires may now need to go through longer paths.

Placement algorithms are limited in how they can place cells by the timing constraints placed on the design. The timing constraints may result in certain parts of the design being very congested in terms of the wiring (or interconnection) resources needed to connect the cells in those parts of the circuit. It would be possible to relieve the congestion if somehow the cells in the congested area were to be moved apart. However, moving the cells apart may result in an increase in the interconnection delays, which in turn may result in a violation of the timing constraints. Thus a situation results where it is possible to have acceptable timing slacks or acceptable congestion but not both.

The paper by Villarubia and Hojat (ICCD 97) proposes integrated logic optimization and placement. However, the proposed methodology alternates placement and logic optimization and does not consider the impact of the logic optimizations on subsequent placement steps.

SUMMARY OF THE INVENTION

This invention recognizes the ability of logic optimization to help placement relieve congestion. Different types of logic optimizations are used to help placement relieve congestion. In one type of optimization, the speed of parts of the circuit is improved by selecting faster cells. In another type of optimization, the topology of the circuit is changed such that placement can now move cells, which could not have been moved before, to reduce congestion and thus enable routing. A distinguishing feature of this methodology is that it not only uses the placement information for interconnection delay/area estimates during logic optimization, but also uses logic optimization to aid the physical placement steps by providing support to placement so that the congestion of the circuit is improved. The aim is to avoid getting into a situation where the placed circuit cannot be routed.

There are two specific ways in which logic optimization aids placement in relieving congestion. The first method involves determining parts of the circuit which are congested, and then speeding up the logic in these parts. This speedup provides timing slack for a subsequent placement step to move cells while ensuring that this move does not cause the modified interconnections to violate timing constraints. The second method involves modifying the topology of the circuit by adding gates while maintaining the functionality, such that the added gates can then be moved by the placement steps to relieve congestion.

An important aspect of the optimizations, specifically directed towards helping placement relieve congestion, is the ability to undo modifications if placement does not actually use the modifications. The undo capability ensures that no area/power resources are wasted for transformations that are not used as intended.

A critical problem in using logic optimization as part of placement is that logic optimization steps can and do increase the area of circuits. This increase in area can invalidate the results of any placement done thus far, and consequently result in the inability of the combination of these steps to converge. An important part of this invention is to actively bound the area increase of specific parts of the circuit which guarantees that the current placement results are still valid after the logic optimizations, consequently guaranteeing convergence of the integrated logic optimization and placement steps.

BRIEF DESCRIPTION OF THE DRAWING

The present invention may be further understood from the following description in conjunction with the appended drawing. In the drawing:

FIG. 1 is a flowchart of traditional cell-based design flow;

FIG. 2 is a flowchart of design flow in accordance with the present invention;

FIG. 3(a) is a diagram of a gate having a large fanout;

FIG. 3(b) is a diagram of the gate of FIG. 3(a) following fanout splitting using buffering;

FIG. 3(c) is a diagram of a circuit equivalent to the gate of FIG. 3(a) following fanout splitting using node splitting;

FIG. 4(a) is a diagram of a circuit to which intra-bin pin density logic optimization may be applied;

FIG. 4(b) is a diagram of an equivalent circuit resulting from intra-bin pin density logic optimization applied to the circuit of FIG. 4(a);

FIG. 5(a) is a diagram of a circuit to which inter-bin pin density logic optimization may be applied;

FIG. 5(b) is a diagram of an equivalent circuit resulting from inter-bin pin density logic optimization applied to the circuit of FIG. 5(a);

FIG. 6(a) is a diagram of a circuit to which input splitting logic optimization may be applied;

FIG. 6(b) is a diagram of an equivalent circuit resulting from input splitting logic optimization applied to the circuit of FIG. 6(a);

DETAILED DESCRIPTION OF THE PREFERRED EMBODIMENTS

Figure 7:
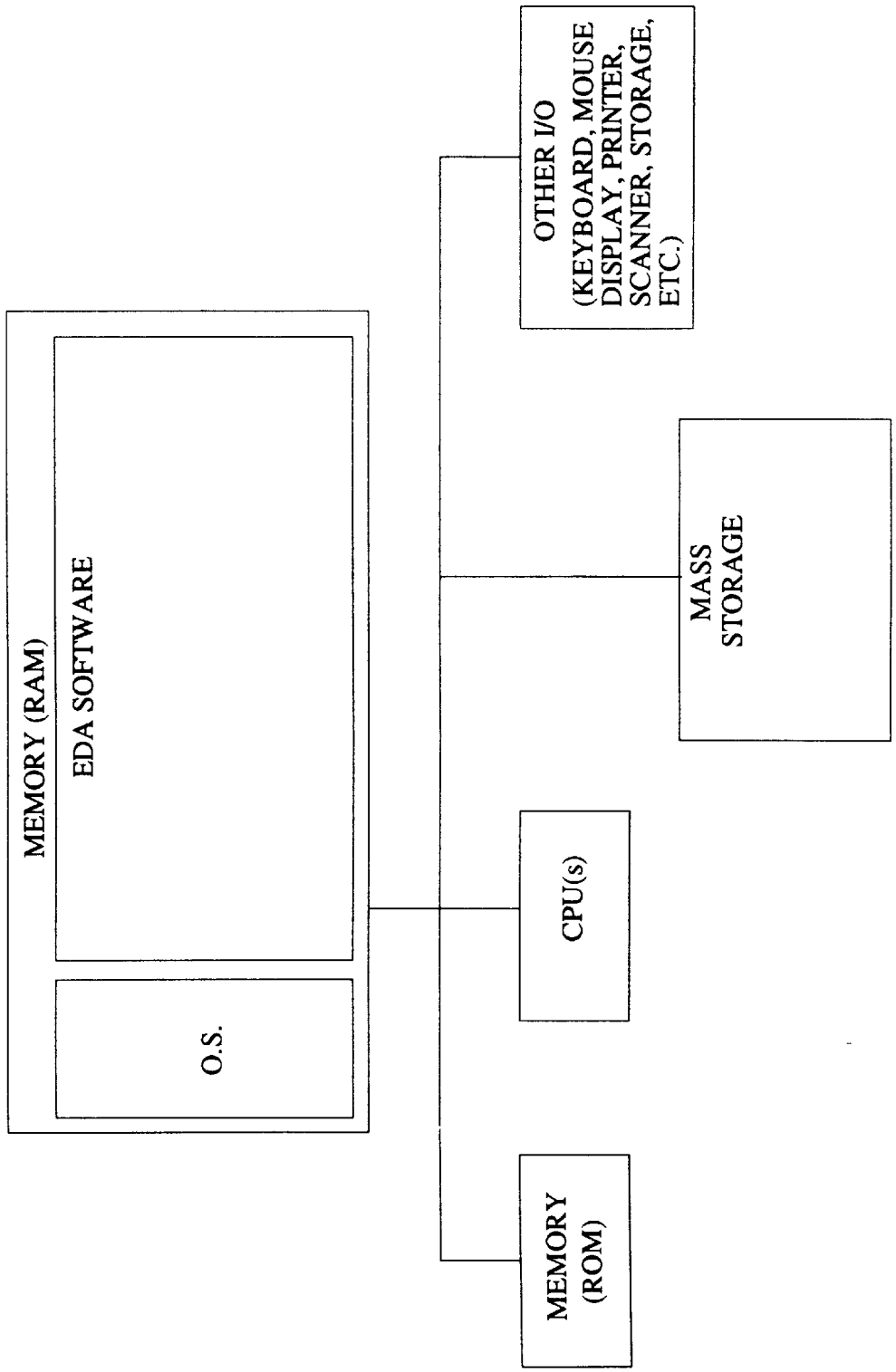
FIG. 7 is a block diagram of a computer system that may be used to practice the present invention.

The present invention may be used in conjunction with an electronic design automation placement tool. In accordance with an exemplary embodiment of one such placement tool, at each stage in cell placement, the cells are partitioned into a number of bins. Interconnection models for interconnects between bins and within bins provide both delay estimates for each interconnect in the circuit, as well as congestion estimates for each bin in the circuit. The circuit has timing constraints imposed on it that it needs to satisfy. The delay estimates of the interconnection, combined with the delays of the cells and the timing constraints imposed on the design, are converted to timing slack information for each part of the circuit. A negative timing slack indicates that that part of the circuit is not meeting the timing constraints. A positive slack indicates that that part of the circuit is producing its result faster than is needed and can thus be slowed down without violating its timing constraints. More generally, "slack" is defined herein as a measure of the degree to which a timing requirement is met in an integrated circuit design.

The traditional role of logic synthesis has been to identify areas of the circuit which have negative timing slack and then modify the circuit so as to fix this problem. As described herein, logic synthesis is used to aid placement to achieve both acceptable delays and congestion, by making circuit modifications that increase the timing slack in the congested parts. Referring more particularly to FIG. 2, the steps involved in this process are, in general, as follows:

Initial placement of cells into bins (Step 1).

Calculation of delay estimates, i.e., slack estimates, and congestion estimates (Step 2).

Identification of critical paths and/or congested circuits (Step 3). In the case of congested circuits, identification of cells to be modified for in order for placement moves to relieve congestion.

Modification of logic to improve delay (Step 4), e.g., speeding up part of the circuit to improve slack in that part of the circuit. Conventional logic optimization techniques such as remapping and buffering are used for this. The purpose of this step is twofold. Such timing improvement is desirable in and of itself Also, if positive slack is achieved for parts of the congested circuit, this positive slack provides room for a subsequent placement step to move the cells in this part further away to reduce congestion.

Modification of logic to potentially improve circuit congestion (Step 5). Techniques such as fanout splitting are used for this.

Placement modification to take advantage of the preceding modifications (Step 6).

Undo logic modifications not used in the preceding placement modifications (Step 7).

Update slack and congestion estimates (Step 8).

Repeat for so long as significant improvement is obtained (Step 9).

Note that in various embodiments of the invention, not all of the foregoing steps may be practiced and that the order of the steps practiced may vary from the order of steps as presented above.

Particular logic modifications used to relieve congestion will be described in greater detail. Placement algorithms are limited in how they can place cells by the topology of the circuit. If the output of cell A is connected to (also referred to as "fanning out to") four different terminals in different cells (indicated by the numbers 1–4) in FIG. 3(a), then the placement of A is strongly influenced by the placement of cells corresponding to these terminals. In addition, because the output of A needs to be routed to four different places, the output of A is likely to cause congestion in this part of the circuit. Modifying the circuit topology without changing the logic functionality can avoid the bunching of wires at the output of A. This general step is referred to as fanout splitting. There are two distinct ways in which fanout splitting is done.

The first method involves buffering and is illustrated in FIG. 3(b). Here buffers B and C are added such that B is used to drive terminals 1 and 2 and C is used to drive 3 and 4. The grouping of terminals and assignments to buffers is done using geometric proximity of the terminals. Once the fanouts have been distributed between the buffers, a subsequent placement step can now move the buffers closer to the terminal they are connected to, relieving congestion due to the large fanout at the output of A.

In FIG. 3(c) an alternative technique is used. Two copies of node A are used, labeled A1 and A2, with A1 fanning out to 1 and 2, and A2 fanning out to 3 and 4. This technique is referred to as node splitting. Once node splitting is done a subsequent placement step can move A1 or A2 closer to the terminals they are connected to, in order to relieve congestion.

To summarize, the steps involved in fanout splitting are:

Identification of congested bins. This is done using the congestion estimates for each bin.

Identification of large fanout cells resulting in congestion.

Modification of the circuit topology using fanout splitting by either buffering or node splitting.

Further examples of logic modifications that may be used to relieve congestion will now be described.

One measure of the congestion in a bin is given by pin density, calculated as the total number of pins in the bin divided by the total routable area in the bin. Here a pin refers to either an input or an output of a cell. It is desirable to get a lower congestion since that is likely to make routing easier. It is possible for logic optimizations to directly reduce this measure of congestion.

Intra-bin pin density logic optimization is done by replacing a set of gates in a bin with a different but logically equivalent set. Referring to FIG. 4(a), the AND gate followed by the NOR gate is logically equivalent to the AND-OR-INVERT gate shown in FIG. 4(b). In this case assume that the total routable area is the same before and after the logic change. However, the AND-OR-INVERT gate in FIG. 4(b) has fewer pins (4) compared to the AND and the NOR gates (3 each for a total of 6 pins) in FIG. 4(a). Intuitively, elimination of the extra net between the AND and the NOR gate in FIG. 4(a) will make the bin less congested.

Pin density can be reduced in a congested bin by possibly increasing it in a less congested bin. This technique is referred to as inter-bin logic optimization. FIG. 5(a) shows two AND gates in different bins. Assume that Bin 1 is over congested and Bin 2 is undercongested. By using the associative property of AND gates, a connection (C) can be moved from the AND gate in Bin 1 to that in Bin 2 as shown in FIG. 5(b). This reduces the pin density in Bin 1 (the number of pins is reduced from 4 to 3) and thus reduces congestion. Note that the pin density and thus the congestion in Bin 2 has increased in the process (the number of pins increases from 3 to 4), but that is acceptable since Bin 2 was undercongested.

Another logic optimization technique is input splitting. The motivation for this technique is similar to that for fanout splitting. A gate with a large number of input pins is replaced by a set of gates each one of which has a smaller number of input pins. While this may increase the pin density, it provides flexibility for a subsequent placement step to move some of these gates from an over congested bin to an undercongested bin in order to improve congestion.

FIG. 4(b) shows an AND-OR-INVERT gate with three inputs. Input splitting results in this gate being replaced by the an AND gate followed by a NOR gate as in FIG. 4(a). While this may result in increasing the pin density in the bin, it allows a subsequent placement step to move either of the two gates into a different undercongested bin.

FIG. 6(a) shows a three input AND gate. Input splitting results in this being replaced by two, two input AND gates as shown in FIG. 6(b). A subsequent placement step may now move either of these gates to a different undercongested bin.

For many of the congestion relieving logic synthesis methods proposed as part of placement, there are two important issues that this invention addresses. In most cases, logic synthesis cannot itself improve congestion, but rather only provide opportunities for placement to improve congestion, it is important to track which of these opportunities are actually used. Any unused opportunities may result in wasted resources, since the logic optimization step used to create them typically uses additional area and power (for faster cells) or additional gates. The use of the logic optimizations during placement is therefore actively tracked. Any unused optimizations are undone to ensure that there are no wasted resources.

It is important that the area used by the logic optimizations be monitored. Because the current placement (at the time of the logic optimizations) is based on a certain area of all the bins, if this information changes, then the placement may no longer be appropriate. The change may result in placement being done again at that step, and possibly the process never converging. Monitoring of the area used in order to preserve the feasibility of the placement is done by placing an upper bound on the area of each bin. The proposed logic optimizations are only allowed to increase the bin area to the upper bound. Bounding the increase in bin area guarantees convergence of the placement process.

The present invention may be embodied in various forms, including computer-implemented methods, computer systems configured to implement such methods, computer-readable media containing instructions for implementing such methods, etc. Examples of computer-implemented methods embodying the invention have been described. Reducing such methods to tangible form as computerreadable media may be accomplished by methods well-known in the art.

Referring to FIG. 7, a diagram is shown of a computer system that may be used to practice the present invention. Attached to a system bus are one or more CPUs, read-only memory (ROM), read/write memory (RAM), mass storage, and other I/O devices. The other I/O devices will typically include a keyboard, a pointing device, and a display, and may further include any of a wide variety of commercially-available I/O devices, including, for example, magnetic storage devices, optical storage devices, other storage devices, printers, etc. Stored within memory (e.g., RAM) is software (e.g., EDA software) implementing methods of the type previously described.

New deep submicron technologies are resulting in a much stronger dependence between the steps of logic optimization, cell placement and interconnection routing. Consequently, current design methodologies that handle these steps separately result in too many iterations over these steps and possibly no convergence, causing long delays in the design process. This invention will significantly reduce, if not eliminate, the iterations needed by considering not only the impact of interconnect during logic optimization of area/timing, but also at the same time doing logic optimization to help placement relieve congestion and thus generate a circuit that is easily routable.

It will be appreciated by those of ordinary skill in the art that the invention can be embodied in other specific forms without departing from the spirit or essential character thereof The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of modifying an integrated circuit design to facilitate placement of circuit elements within one or more regions called bins on an integrated circuit design layout, comprising the steps of:

performing an initial placement of integrated circuit elements within bins on the design layout;

calculating congestion of the initial placement; and subject to limits on the increase in area of integrated circuit elements within a bin, performing logic modifications within selected bins of the integrated circuit design to allow congestion of the placement to be improved.

2. The method of claim 1, comprising the further step of performing placement refinement in an attempt to improve congestion by taking advantage of the logic modifications.

3. The method of claim 2, comprising the further steps of:

tracking logic modifications to determine which logic modifications resulted in placement modifications during placement refinement; and undoing logic modifications that did not result in placement modifications.

4. The method of claim 2, comprising the further step of modifying logic within the integrated circuit design to improve timing performance of the integrated circuit design subject to limits on the increase in area of integrated circuit elements within a bin.

5. The method of claim 4, wherein modifying logic to improve timing performance comprises speeding up part of the circuit to improve timing slack in that part of the circuit.

6. The method of claim 2, comprising the further steps of:
calculating congestion of the placement following placement refinement; and
depending on the degree to which congestion has been improved, repeating said steps of modifying logic and performing placement refinement.

7. The method of claim 2, wherein modifying logic comprises replacing an original set of gates in the circuit with a different set of gates that is logically equivalent to the original set of gates.

8. The method of claim 7, wherein the different set of gates results in a lower ratio of number of pins to routable area in at least one bin.

9. The method of claim 7, wherein modifying logic comprises replacing a single gate having a plural number N of fanouts with a plurality of gates each having fewer than N fanouts.

10. The method of claim 7, wherein modifying logic comprises inserting buffers within a fanout tree of a gate.

11. The method of claim 7, wherein modifying logic comprises replacing a single gate having a plural number N of fanins with a plurality of gates each having fewer than N fanins.

12. A method of modifying an integrated circuit design to facilitate placement of circuit elements within one or more regions called bins on an integrated circuit design layout, comprising the steps of:
performing an initial placement of integrated circuit elements within bins on the design layout, connections between the integrated circuit elements being represented as nets within a netlist describing the integrated circuit design;
calculating congestion of the initial placement; and
subject to limits on the increase in area of integrated circuit elements within a bin, performing logic modifications within selected bins of the integrated circuit design;
wherein the logic modifications improve timing of selected nets belonging to the selected bins, reducing constraints on a subsequent placement step.

13. The method of claim 12, comprising the further step of performing placement refinement in an attempt to improve congestion by taking advantage of the logic modifications.

14. The method of claim 13, comprising the further steps of:
tracking logic modifications to determine which logic modifications resulted in placement modifications during placement refinement; and
undoing logic modifications that did not result in placement modifications.

15. A computer-readable medium including instructions for modifying an integrated circuit design to facilitate placement of circuit elements within one or more regions called bins on an integrated circuit design layout, including instructions for:
performing an initial placement of integrated circuit elements within bins on the design layout;
calculating congestion of the initial placement; and
subject to limits on the increase in area of integrated circuit elements within a bin, performing logic modifications within selected bins of the integrated circuit design to allow congestion of the placement to be improved.

16. A computer-readable medium including instructions for modifying an integrated circuit design to facilitate placement of circuit elements within one or more regions called bins on an integrated circuit design layout, including instructions for:
performing an initial placement of integrated circuit elements within bins on the design layout, connections between the integrated circuit elements being represented as nets within a netlist describing the integrated circuit design;
calculating congestion of the initial placement; and
subject to limits on the increase in area of integrated circuit elements within a bin, performing logic modifications within selected bins of the integrated circuit design;
wherein the logic modifications improve timing of selected nets belonging to the selected bins, reducing constraints on a subsequent placement step.

17. Apparatus for modifying an integrated circuit design to facilitate placement of circuit elements within one or more regions called bins on an integrated circuit design layout, comprising:
means for performing an initial placement of integrated circuit elements within bins on the design layout;
means for calculating congestion of the initial placement; and
means for, subject to limits on the increase in area of integrated circuit elements within a bin, performing logic modifications within selected bins of the integrated circuit design to allow congestion of the placement to be improved.

18. Apparatus for modifying an integrated circuit design to facilitate placement of circuit elements within one or more regions called bins on an integrated circuit design layout, comprising:
means for performing an initial placement of integrated circuit elements within bins on the design layout, connections between the integrated circuit elements being represented as nets within a netlist describing the integrated circuit design;
means for calculating congestion of the initial placement; and
means, subject to limits on the increase in area of integrated circuit elements within a bin, performing logic modifications within selected bins of the integrated circuit design;
wherein the logic modifications improve timing of selected nets belonging to the selected bins, reducing constraints on a subsequent placement step.

* * * * *